United States Patent
Senoo et al.

(10) Patent No.: US 10,411,207 B2
(45) Date of Patent: Sep. 10, 2019

(54) ORGANIC EL DISPLAY DEVICE

(71) Applicant: Sharp Kabushiki Kaisha, Sakai, Osaka (JP)

(72) Inventors: Tohru Senoo, Sakai (JP); Takeshi Hirase, Sakai (JP); Takashi Ochi, Sakai (JP); Tohru Sonoda, Sakai (JP); Mamoru Ishida, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days.

(21) Appl. No.: 16/087,120

(22) PCT Filed: Mar. 17, 2017

(86) PCT No.: PCT/JP2017/010908
§ 371 (c)(1),
(2) Date: Sep. 21, 2018

(87) PCT Pub. No.: WO2017/164115
PCT Pub. Date: Sep. 28, 2017

(65) Prior Publication Data
US 2019/0140199 A1    May 9, 2019

(30) Foreign Application Priority Data
Mar. 24, 2016 (JP) .................. 2016-059993

(51) Int. Cl.
*H01L 51/00* (2006.01)
*H05B 33/02* (2006.01)
(Continued)

(52) U.S. Cl.
CPC ...... *H01L 51/0097* (2013.01); *H01L 27/3244* (2013.01); *H01L 51/56* (2013.01);
(Continued)

(58) Field of Classification Search
CPC . H01L 51/0097; H01L 51/56; H01L 27/3244; H01L 51/50; H01L 2251/558;
(Continued)

(56) References Cited

U.S. PATENT DOCUMENTS

| | | | |
|---|---|---|---|
| 2009/0096373 A1* | 4/2009 | Kitai | H01J 1/74 313/509 |
| 2015/0062525 A1 | 3/2015 | Hirakata | |

(Continued)

FOREIGN PATENT DOCUMENTS

| | | |
|---|---|---|
| JP | 2015-064570 A | 4/2015 |
| JP | 2016-015618 A | 1/2016 |
| WO | 2015/100333 A1 | 7/2015 |

OTHER PUBLICATIONS

Official Communication issued in International Patent Application No. PCT/JP2017/010908, dated Jun. 13, 2017.

*Primary Examiner* — John P. Dulka
(74) *Attorney, Agent, or Firm* — Keating & Bennett, LLP

(57) ABSTRACT

An organic EL display device (1) includes: an organic EL display panel (2) including a flexible plastic substrate and an organic EL element formed on the plastic substrate; and a protective member (3) provided on the organic EL display panel (2), the protective member (3) being bendable. The protective member (3) includes a plurality of protective layers (3a) to (3e) stacked so as to be mutually slidable. The organic EL display panel (2) and the protective layer (3a) being in contact with the organic EL display panel (2) are fixed to each other.

20 Claims, 12 Drawing Sheets

(51) Int. Cl.
  *H05B 33/04*    (2006.01)
  *H01L 27/32*    (2006.01)
  *H01L 51/56*    (2006.01)
(52) U.S. Cl.
  CPC ............. *H05B 33/02* (2013.01); *H05B 33/04* (2013.01); *H01L 2251/5338* (2013.01); *H01L 2251/558* (2013.01)
(58) Field of Classification Search
  CPC ... H01L 2251/5338; H01L 27/32; G09F 9/30; H05B 33/04; H05B 33/02
  See application file for complete search history.

(56) References Cited

U.S. PATENT DOCUMENTS

| | | | |
|---|---|---|---|
| 2016/0007441 A1* | 1/2016 | Matsueda | G06F 1/1652 361/749 |
| 2016/0037625 A1* | 2/2016 | Huitema | H05K 1/028 361/749 |
| 2017/0227807 A1 | 8/2017 | Hirakata | |
| 2017/0338442 A1* | 11/2017 | Ishida | G09F 9/30 |

* cited by examiner

ORGANIC EL DISPLAY DEVICE

TECHNICAL FIELD

The present invention relates to an organic EL display device including an organic electroluminescence element (hereinafter referred to as an "organic EL element").

BACKGROUND ART

In recent years, liquid crystal displays are often used as flat panel displays in various fields. However, the following problems still remain. Contrast and tinge greatly vary depending on viewing angles. A need for a light source such as a backlight hinders lower power consumption. Reduction in the thickness and weight of a liquid crystal device is limited. Liquid crystal display devices have serious problems also in flexibility.

To address the problems, self-luminous organic EL display devices including organic EL elements are expected in place of liquid crystal display devices. In an organic EL element, a current flows through organic EL layers sandwiched between an anode and a cathode so that organic molecules forming the organic EL layers emit light. Organic EL display devices including such an organic EL element, which are self-luminous, have their thickness and weight easily reduced, and consume less power. The organic EL display devices, which have a wide viewing angle, receive great attention as flat panels that have an advantage over liquid crystal panels.

Flexible organic EL display devices including a plastic substrate draw special attention. The plastic substrate has higher flexibility, higher shock resistance, and lower weight than a glass substrate. Such a plastic substrate would provide new organic EL display devices beyond typical displays including a glass substrate.

Here, such a flexible organic EL display device, which has a pliant structure, warps due to vibrations and other factors. As a result, an intended luminous intensity may be unable to be obtained, or an organic EL element may be broken.

To avoid these inconveniences, an organic EL display device including a protective plate to improve the mechanical strength of the device has been proposed. More specifically, at least one of upper and lower surfaces of such an organic EL display device is provided with a protective plate (a support plate) made of resin, rubber, or any other suitable material. Such a configuration may increase the mechanical strength of a bent portion (see, for example, Patent Document 1).

CITATION LIST

Patent Document

[Patent Document 1] Japanese Unexamined Patent Publication No. 2015-064570

SUMMARY OF THE INVENTION

Technical Problem

Here, if the organic EL display device of Patent Document 1 described above includes a thin protective plate, it cannot have a sufficiently high mechanical strength. Thus, to improve the mechanical strength, the thickness of the protective plate needs to be increased. Unfortunately, as the thickness of the protective plate increases, the bend radius thereof increases. This lowers the flexibility of the flexible organic EL display device.

In view of the foregoing background, it is therefore an object of the present invention to improve the mechanical strength of a flexible organic EL display device without lowering the flexibility thereof.

Solution to the Problem

To achieve the foregoing object, an organic EL display device according to the present invention includes an organic EL display panel including a flexible plastic substrate and an organic EL element formed on the plastic substrate; and a protective member provided on the organic EL display panel, the protective member being bendable, wherein the protective member includes a plurality of protective layers stacked so as to be mutually slidable, and the organic EL display panel and one of the protective layers being in contact with the organic EL display panel are fixed to each other.

Advantages of the Invention

According to the present invention, the thickness of a protective member is increased without lowering the flexibility of an organic EL display panel, thereby improving the mechanical strength of the organic EL display panel.

DESCRIPTION OF EMBODIMENTS

Embodiments of the present invention will now be described in detail with reference to the drawings. Note that the present invention is not limited to the following embodiments.

First Embodiment

Figure 1:
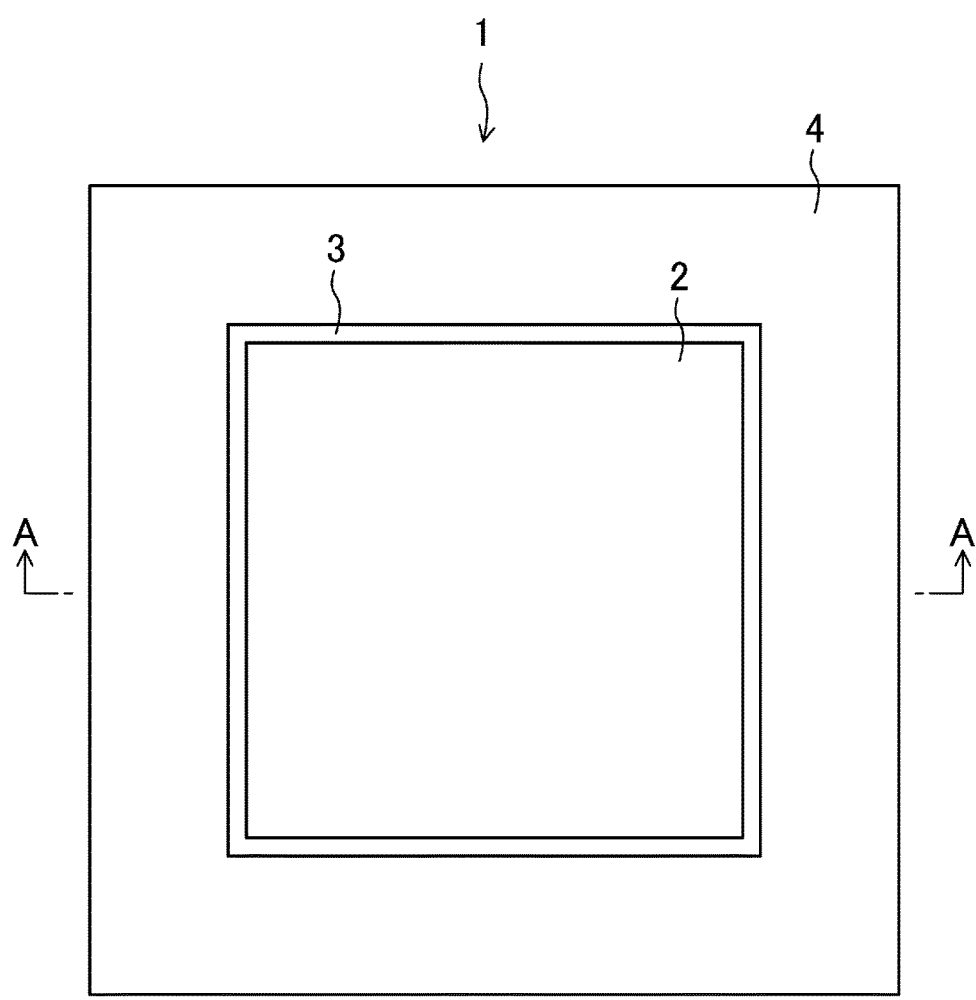
FIG. 1 is a plan view schematically showing a configuration of an organic EL display device according to a first embodiment of the present invention.
Figure 2:
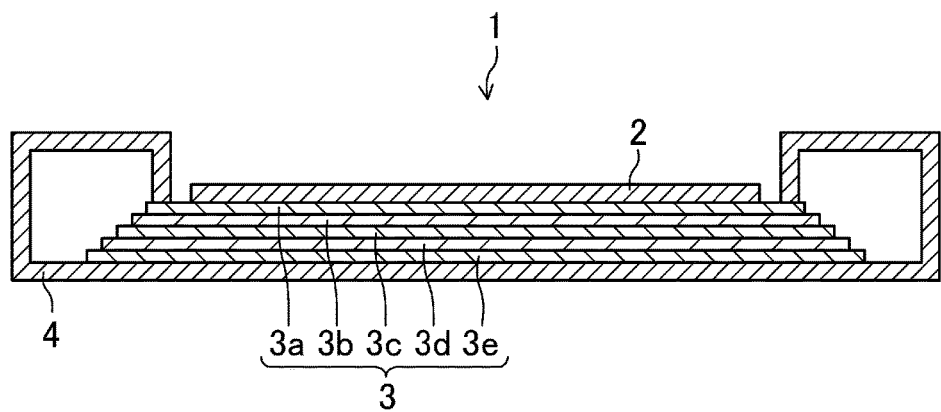
FIG. 2 is a cross-sectional view schematically showing a configuration of the organic EL display device according to the first embodiment of the present invention and taken along line A-A shown in FIG. 1.
Figure 3:
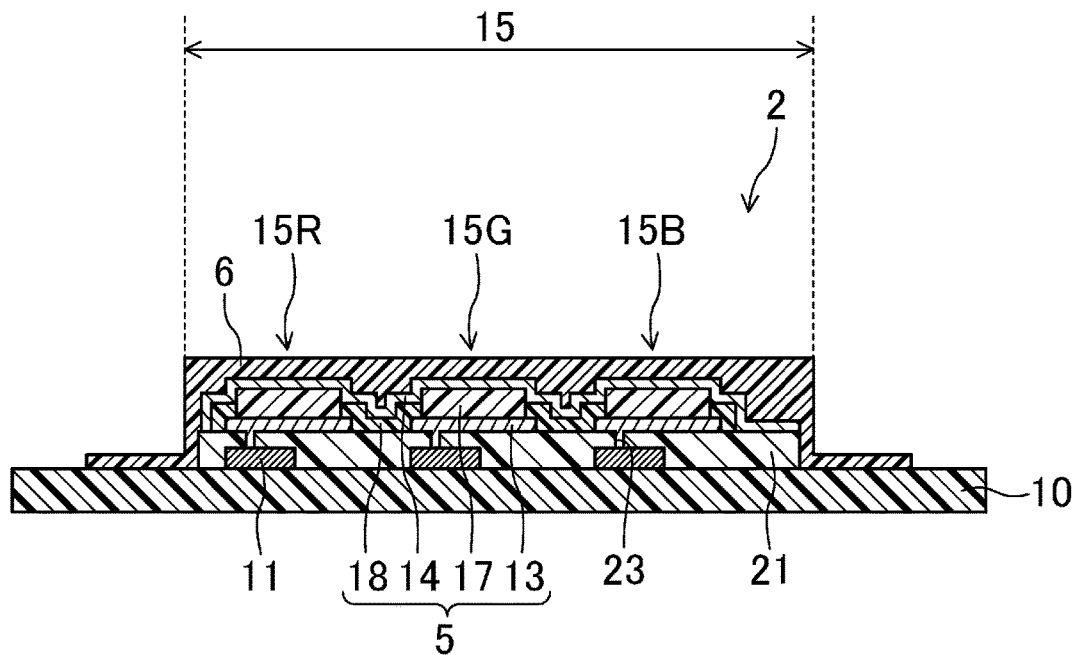
FIG. 3 is a cross-sectional view of an organic EL display panel according to the first embodiment of the present invention.
Figure 4:
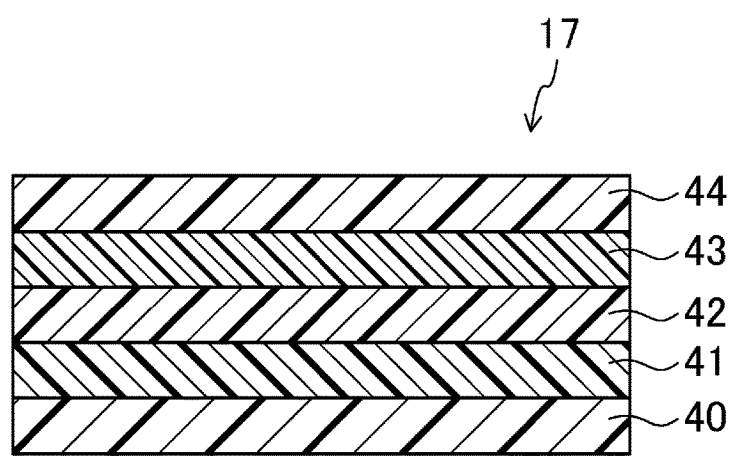
FIG. 4 is a cross-sectional view illustrating an organic EL layer forming part of an organic EL element of the organic EL display panel according to the first embodiment of the present invention.

FIG. 1 is a plan view schematically showing a configuration of an organic EL display device according to this embodiment. FIG. 2 is a cross-sectional view schematically showing a configuration of the organic EL display device according to this embodiment and taken along line A-A shown in FIG. 1. FIG. 3 is a cross-sectional view of an organic EL display panel according to this embodiment. FIG. 4 is a cross-sectional view illustrating an organic EL layer forming part of an organic EL element of the organic EL display panel according to this embodiment.

As illustrated in FIGS. 1 and 2, an organic EL display device 1 includes an organic EL display panel 2, a protective member 3 provided in contact with the organic EL display panel 2, and a support member 4 for supporting the protective member 3.

As illustrated in FIG. 3, the organic EL display panel 2 includes a plastic substrate 10 being an element substrate, and organic EL elements 5 above the plastic substrate 10.

The plastic substrate 10 is a flexible film-like substrate made of an insulating resin material. The resin material forming the plastic substrate 10 may be, for example, an organic material such as polyimide resin and acrylic resin.

As illustrated in FIG. 3, the organic EL display panel 2 includes a display region 15 in which the organic EL elements 5 are placed. Specifically, in the display region 15, the organic EL elements 5 are arranged in a matrix above the plastic substrate 10. This display region 15 is formed by arranging pixel regions 15R emitting red light, pixel regions 15G emitting green light, and pixel regions 15B emitting blue light in a predetermined pattern.

As illustrated in FIG. 3, each organic EL element 5 includes, above the plastic substrate 10, a predetermined array (e.g., a matrix) of first electrodes (anodes) 13, organic EL layers 17 on the respective first electrodes 13, and a second electrode 14 on the organic EL layers 17.

Each organic EL element 5 also includes an edge cover 18 to cover the peripheral edge of the associated first electrode 13 and regions without the first electrode 13. Each edge cover 18 is interposed between the pixel regions 15R, 15G, and 15B, and functions as a partition defining each of the pixel regions 15R, 15G, and 15B.

As illustrated in FIG. 3, the organic EL display panel 2 includes TFTs 11 and an interlayer insulating film 21. Each TFT 11 is formed on the plastic substrate 10 and electrically connected to one of the first electrodes 13 arranged in the predetermined array. The interlayer insulating film 21 is formed on the plastic substrate 10 to cover the TFTs 11.

The first electrodes 13 function to inject holes (positive holes) into the organic EL layers 17. The first electrodes 13 preferably contain a material with a high work function. This is because a material with a high work function allows the first electrodes 13 to inject positive holes into the organic EL layers 17 with higher efficiency. Furthermore, as illustrated in FIG. 3, the first electrodes 13 are formed on the interlayer insulating film 21.

Examples of the material for the first electrodes 13 include metal materials such as silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The first electrodes 13 may also be an alloy of, for example, magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), or lithium fluoride (LiF)/calcium (Ca)/aluminum (Al). The first electrodes 13 may also be a conductive oxide such as tin oxide (SnO), zinc oxide (ZnO), indium tin oxide (ITO), and indium zinc oxide (IZO).

Moreover, the first electrodes 13 may be multilayers containing the above materials. Examples of materials with a high work function include indium tin oxide (ITO) and indium zinc oxide (IZO).

The interlayer insulating film 21 is formed on the plastic substrate 10, and functions to flatten the surface of a film on which the TFTs 11 are provided. Due to the interlayer insulating film 21, the first electrodes 13 and the organic EL layers 17 are formed flat on or above the interlayer insulating film 21. That is, the planarization using the interlayer insulating film 21 reduces the risk that steps, protrusions, and recesses of the underlayers in the organic EL display device 1 influence the shape of the surface of the first electrodes 13, causing light emission by the organic EL layer 17 to be non-uniform. The interlayer insulating film 21 contains a highly transparent, low-cost organic resin material such as acrylic resin.

As illustrated in FIG. 3, the first electrodes 13 are electrically connected to the TFTs 11 via contact holes 23 formed in the interlayer insulating film 21.

Each organic EL layer 17 is formed on a surface of an associated one of the first electrodes 13 arranged in a matrix. As illustrated in FIG. 4, each organic EL layer 17 includes a positive hole injection layer 40, a positive hole transport layer 41, a light-emitting layer 42, an electron transport layer 43, and an electron injection layer 44. The positive hole transport layer 41 is formed on a surface of the positive hole injection layer 40. The light-emitting layer 42 is formed on a surface of the positive hole transport layer 41, and emits one of red, green, or blue light. The electron transport layer 43 is formed on a surface of the light-emitting layer 42. The electron injection layer 44 is formed on a surface of the electron transport layer 43. Each organic EL layer 17 is formed by sequentially stacking the positive hole injection layer 40, the positive hole transport layer 41, the light-emitting layer 42, the electron transport layer 43, and the electron injection layer 44. The organic EL layer 17 may be smaller in area than the underlying first electrode 13. Alternatively, the organic EL layer 17 may be larger in area than the underlying first electrode 13 to cover the underlying first electrode 13.

The positive hole injection layer 40 is also called an anode buffer layer, and used to bring the energy levels of the first electrode 13 and the organic EL layer 17 close to each other and increase efficiency in injection of positive holes from the first electrode 13 into the organic EL layer 17.

Examples of the material for the positive hole injection layer 40 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The positive hole transport layer 41 increases the efficiency in transporting positive holes from the first electrode 13 to the organic EL layer 17. Examples of the material for the positive hole transport layer 41 include porphyrin derivatives, aromatic tertiary amine compounds, styrylamine derivatives, polyvinylcarbazole, poly-p-phenylene vinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 42 is a region in which the positive holes and the electrons are respectively injected thereinto from the first electrode 13 and the second electrode 14 and recombine with each other when a voltage is applied from the first electrode 13 and the second electrode 14. This light-emitting layer 42 is made of a material with high luminous efficiency. Examples of the material include metal oxinoid compounds [8-hydroxyquinoline metal complexes], naphthalene derivatives, anthracene derivatives, diphenylethylene derivatives, vinylacetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rodamine derivatives, acridine derivatives, phenoxazone, quinacridone derivatives, rubrene, poly-p-phenylene vinylene, and polysilane.

The electron transport layer 43 functions to efficiently move electrons to the light-emitting layer. Examples of the material for the electron transport layer 43 include, as organic compounds, oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds.

The electron injection layer 44 brings the energy levels of the second electrode 14 and the organic EL layers 17 close to each other to increase the efficiency in injecting electrons from the second electrode 14 into the organic EL layers 17, thereby reducing the drive voltage of the organic EL element 5. The electron injection layer may also be called a cathode buffer layer. Examples of the material for the electron injection layer 44 include: inorganic alkaline compounds such as lithium fluoride (LiF), magnesium fluoride ($MgF_2$), calcium fluoride ($CaF_2$), strontium fluoride ($SrF_2$), barium fluoride ($BaF_2$); $Al_2O_3$; and SrO.

The second electrode 14 functions to inject electrons into the organic EL layers 17. It is more preferable that the second electrode 14 contain a material with a low work function. This is because a material with a low work function allows the second electrode 14 to inject electrons into the organic EL layers 17 with higher efficiency. As illustrated in FIG. 3, the second electrode 14 is formed on the organic EL layers 17.

Examples of materials for the second electrode 14 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF). The second electrode 14 may also be an alloy of, e.g., magnesium (Mg)/copper (Cu), magnesium (Mg)/silver (Ag), sodium (Na)/potassium (K), astatine (At)/astatine dioxide ($AtO_2$), lithium (Li)/aluminum (Al), lithium (Li)/calcium (Ca)/aluminum (Al), and lithium fluoride (LiF)/calcium (Ca)/aluminum (Al). The second electrode 14 may also contain a conductive oxide such as tin oxide (SnO), zinc oxide (ZnO), indium tin oxide (ITO), or indium zinc oxide (IZO). The second electrode 14 may be a multilayer containing the above materials.

A material with a low work function may be, for example, magnesium (Mg), lithium (Li), lithium fluoride (LiF), an alloy of magnesium (Mg)/copper (Cu), magnesium (Mg)/silver (Ag), sodium (Na)/potassium (K), lithium (Li)/aluminum (Al), lithium (Li)/calcium (Ca)/aluminum (Al), or lithium fluoride (LiF)/calcium (Ca)/aluminum (Al).

The edge covers 18 function to prevent short-circuit between the first electrodes 13 and the second electrode 14. Thus, the edge covers 18 preferably cover entire peripheral edges of the first electrodes 13.

Examples of the material for the edge covers 18 include silicon dioxide ($SiO_2$), silicon nitride ($SiN_x$, where x is a positive number) such as $Si_3N_4$, and silicon oxynitride (SiNO).

As illustrated in FIG. 3, the organic EL display device 1 also includes a sealing film 6. This sealing film 6 protects the organic EL element 5 from moisture. As illustrated in FIG. 3, the sealing film 6 is provided above the plastic substrate 10 to cover the organic EL elements 5.

In this embodiment, the protective member 3 is configured as a multilayer film including a plurality of protective layers stacked.

More specifically, as illustrated in FIG. 2, five layers, i.e., protective layers 3a to 3e, are stacked to form the protective member 3.

The protective layers 3a to 3e are not fixed to one another by bonding, for example, and are stacked so as to be mutually slidable. The organic EL display panel 2 and the protective member 3 (i.e., the protective layer 3a being in contact with the organic EL display panel 2) are fixed to each other by bonding, for example.

Figure 5:
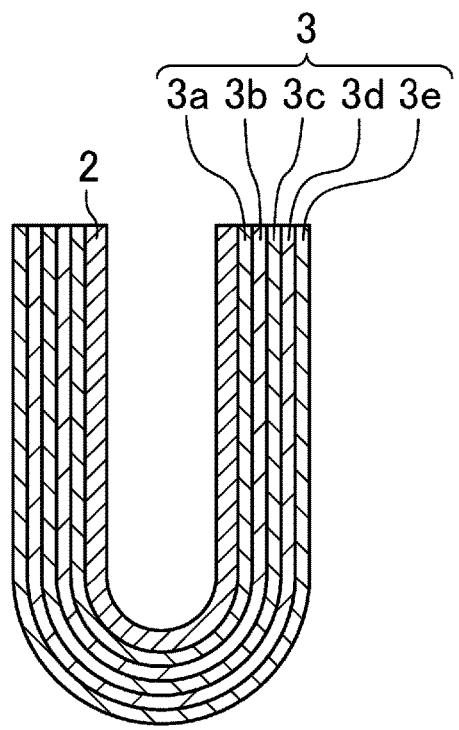
FIG. 5 is a cross-sectional view showing a state where the organic EL display panel according to the first embodiment of the present invention is bent.

Thus, if the organic EL display panel 2 including the protective member 3, shown in FIG. 2, is bent, each of the protective layers 3a to 3e moves while sliding on the surface of one or two of the protective layers being in contact therewith (for example, for the protective layer 3c, the surfaces of the protective layers 3b and 3d being in contact with the protective layer 3c) as illustrated in FIG. 5. This can reduce the bend radius of the organic EL display panel 2.

As a result, the protective layers 3a to 3e are stacked without lowering the flexibility of the organic EL display panel 2, and thus the thickness of the protective member 3 is increased. This can improve the mechanical strength of the organic EL display panel 2.

Examples of a material forming the protective layers 3a to 3e include glass materials, metal materials such as copper, aluminum, and stainless steel, resin materials such as polyethylene, polyester, aramid, and acrylic, and fiber-reinforced polymers (FRP). The protective layers 3a to 3e may contain the same material or different materials. For example, the protective layer 3a in contact with the organic EL display panel 2 may contain a material that can effectively reduce elastic deformation.

To efficiently improve both the flexibility and mechanical strength of the organic EL display panel 2, each of the protective layers 3a to 3e preferably has a thickness ranging from 10 to 300 µm. Each of the protective layers 3a to 3e does not have to have the same thickness.

To improve the slidability of each of the protective layers 3a to 3e, the surfaces of the protective layers 3a to 3e preferably have a coefficient of friction of 0.04 to 1.

Note that the "coefficient of friction" used herein refers to the "coefficient of friction measured according to JIS K 7218 (a friction and wear test)."

The support member 4 is used to support the protective layers 3a to 3e, and contains, for example, a resin material such as nylon, rubber, or any other suitable material. Providing the supporting member 4 can reduce inconveniences such as separation of the protective layers 3a to 3e which are not fixed to one another by bonding or any other process.

Next, a method for making the organic EL display device 1 of this embodiment will be described with reference to FIGS. 6 and 7.

Figure 6:
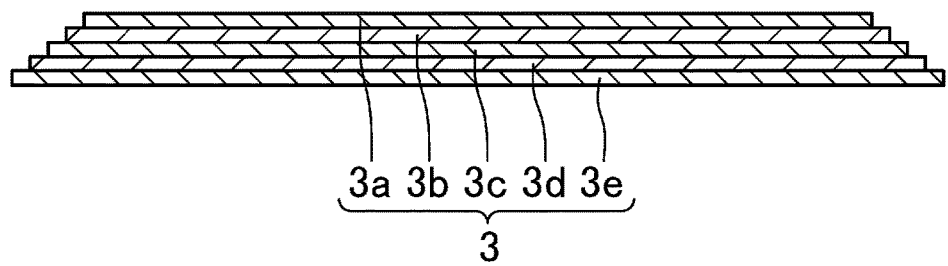
FIG. 6 is a cross-sectional view illustrating a method for making the organic EL display device according to the first embodiment of the present invention.

First, as illustrated in FIG. 6, the protective layers 3a to 3e are sequentially stacked to form the protective member 3 including the protective layers 3a to 3e. In this case, as described above, the protective layers 3a to 3e are not fixed to one another by bonding, for example, and are stacked so as to be mutually slidable.

Figure 7:
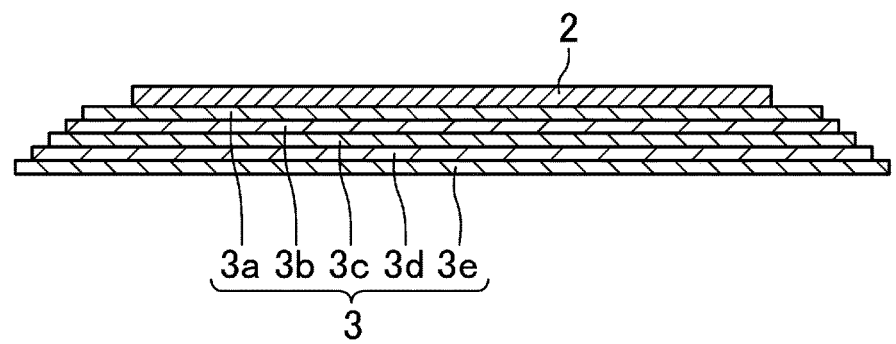
FIG. 7 is a cross-sectional view illustrating the method for making the organic EL display device according to the first embodiment of the present invention.

Next, as illustrated in FIG. 7, the organic EL display panel 2 is arranged on the surface of the protective member 3 (i.e., the protective layer 3a). In this case, as described above, the organic EL display panel 2 and the protective member 3 (i.e., the protective layer 3a being in contact with the organic EL display panel 2) are fixed to each other by bonding, for example.

Next, the support member 4 is brought into contact with surfaces of the protective layers 3a and 3e, and supports the protective member 3, thereby making the organic EL display device 1 shown in FIGS. 1 and 2.

As can be seen, the organic EL display device 1 of this embodiment can provide the following advantages (1) to (4).

(1) The protective member 3 includes the protective layers 3a to 3e stacked so as to be mutually slidable. Thus, when the organic EL display panel 2 is bent, the bend radius of the organic EL display panel 2 can be reduced. As a result, the protective member 3 including the protective layers 3a to 3e can improve the mechanical strength of the organic EL display panel 2 without lowering the flexibility of the organic EL display panel 2.

(2) Since the coefficient of friction of each of the protective layers 3a to 3e is 0.04 to 1, the slidability of the protective layers 3a to 3e can be improved.

(3) Since the thickness of each of the protective layers 3a to 3e is 10 to 300 µm, both the flexibility and mechanical strength of the organic EL display panel 2 can be efficiently improved.

(4) Since the support member 4 for supporting the protective member 3 is provided, inconveniences such as separation of the protective layers 3a to 3e can be reduced.

Second Embodiment

Figure 8:
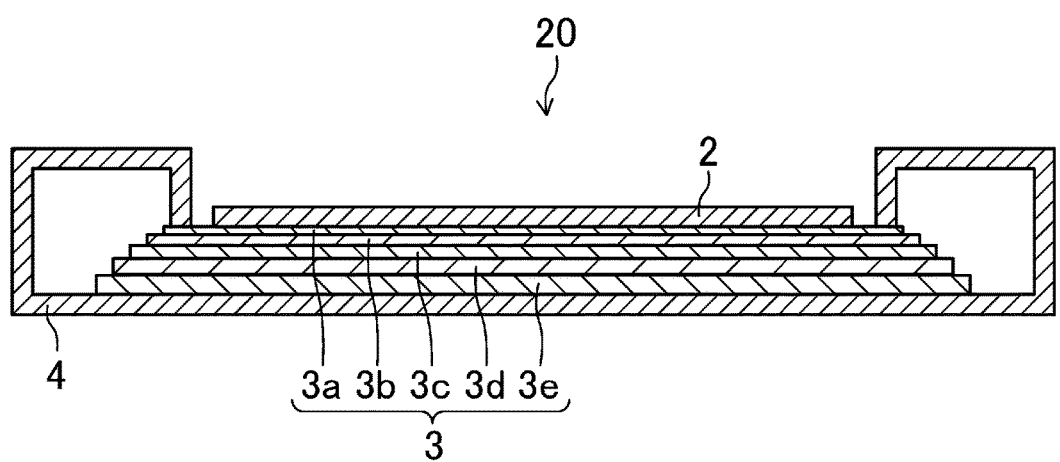
FIG. 8 is a cross-sectional view schematically showing a configuration of an organic EL display device according to a second embodiment of the present invention.

Next, a second embodiment will be described. FIG. 8 is a cross-sectional view schematically showing a configuration of an organic EL display device according to this embodiment. In the following embodiments, components equivalent to those of the first embodiment are denoted by the same reference characters, and the detailed explanation thereof will be omitted.

An organic EL display device 20 of this embodiment is configured such that one of an adjacent pair of protective layers 3a to 3e closer to the organic EL display panel 2 has a smaller thickness than the other.

In the present invention, as described above, the protective layers 3a to 3e do not have to have the same thickness. However, to further improve the flexibility of the organic EL display panel 2, one of an adjacent pair of the protective layers closer to the organic EL display panel 2 preferably has a smaller thickness than the other.

Thus, in this embodiment, one of an adjacent pair of the protective layers 3a to 3e closer to the organic EL display panel 2 has a smaller thickness than the other (i.e., the thickness of the protective layer 3a<the thickness of the protective layer 3b<the thickness of the protective layer 3c<the thickness of the protective layer 3d<the thickness of the protective layer 3e).

The organic EL display device 20 of this embodiment described above can provide the following advantage (5) in addition to the foregoing advantages (1) to (4).

(5) Since one of an adjacent pair of the protective layers 3a to 3e closer to the organic EL display panel 2 has a smaller thickness than the other, the flexibility of the organic EL display panel 2 is further improved.

Third Embodiment

Figure 9:
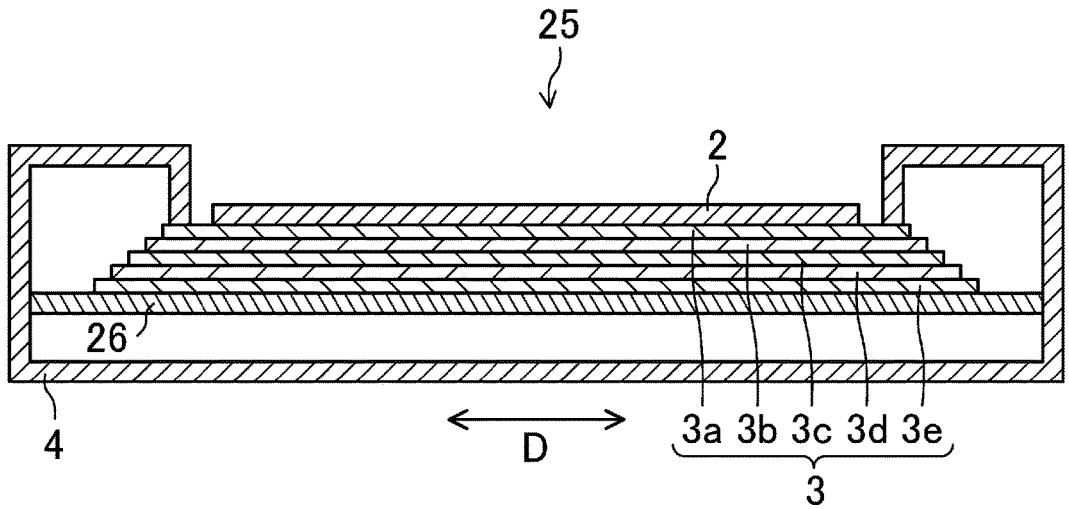
FIG. 9 is a cross-sectional view schematically showing a configuration of an organic EL display device according to a third embodiment of the present invention.

Next, a third embodiment will be described. FIG. 9 is a cross-sectional view schematically showing a configuration of an organic EL display device according to this embodiment.

An organic EL display device 25 of this embodiment includes an elastic member 26 for supporting a protective member 3. The elastic member 26 is provided on a surface of the protective member 3 remote from the organic EL display panel 2.

The elastic member 26 contains, for example, rubber, and end portions thereof in the length direction D are fixed to the support member 4 as illustrated in FIG. 9.

The organic EL display device 25 of this embodiment described above can provide the following advantage (6) in addition to the foregoing advantages (1) to (4).

(6) Since the support member 4 is provided with the elastic member 26 for supporting the protective member 3, inconveniences such as separation of the protective layers 3a to 3e can be reduced.

Other Embodiments

Figure 10:
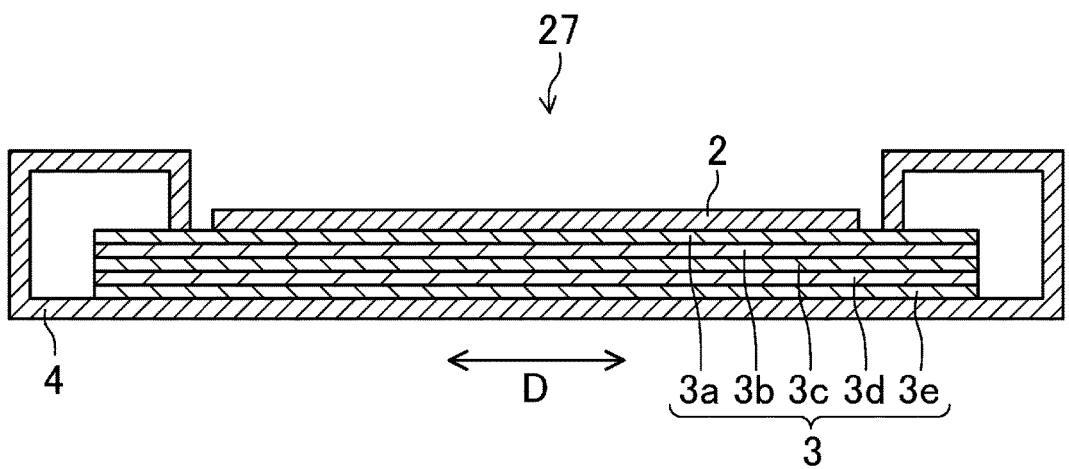
FIG. 10 is a cross-sectional view schematically showing a configuration of an organic EL display device according to a variation of the present invention.

As illustrated in FIG. 10, an organic EL display device 27 may include protective layers 3a to 3e having the same length, and the protective layers 3a to 3e may be stacked so that end surfaces of the protective layers 3a to 3e in the length direction D are flush with one another. Such a configuration can facilitate designing a region surrounding a panel.

Figure 11:
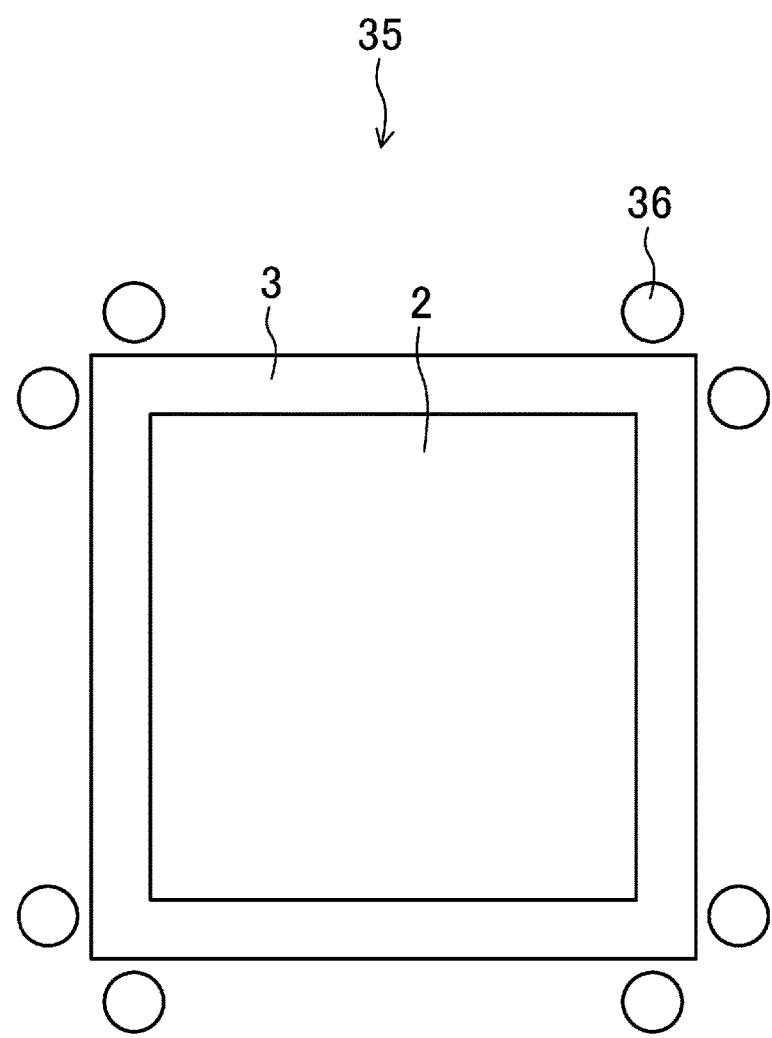
FIG. 11 is a schematic view schematically showing a configuration of an organic EL display device according to another variation of the present invention.

In the foregoing embodiments, the support member 4 for supporting the protective member 3 is provided. However, just like an organic EL display device 35 shown in FIG. 11, guide pins 36 may be provided around the protective member 3 to retain the protective layers 3a to 3e forming the protective member 3. The guide pins 36 also function to guide the protective layers 3a to 3e when the protective member 3 is bent. The guide pins 36 may be provided above the protective member 3 (i.e., near the protective layer 3a), or may be provided below the protective member 3 (i.e., near the protective layer 3e).

Figure 12:
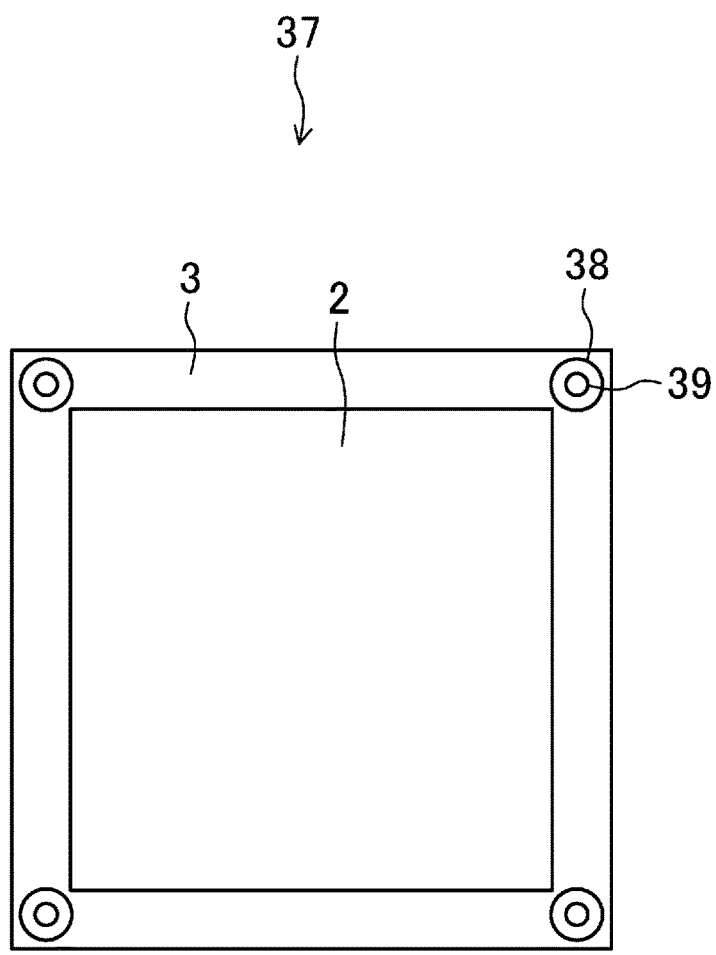
FIG. 12 is a schematic view schematically showing a configuration of an organic EL display device according to still another variation of the present invention.

Just like an organic EL display device 37 shown in FIG. 12, a protective member 3 may have holes 38 through each of which a pin 39 is inserted, thereby retaining the protective layers 3a to 3e forming the protective member 3. The pin 39 may be inserted from above the protective member 3 (i.e., near the protective layer 3a), or may be inserted from below the protective member 3 (i.e., near the protection layer 3e). The number of the pins 39 is merely an example, and may be one.

Figure 13:
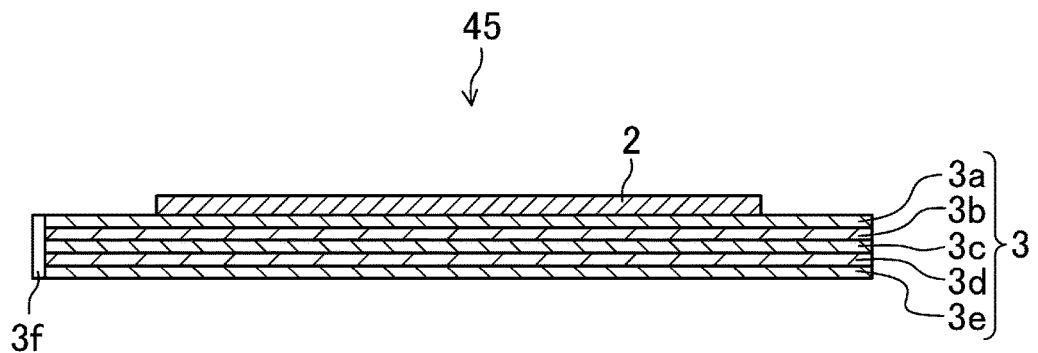
FIG. 13 is a cross-sectional view schematically showing a configuration of an organic EL display device according to yet another variation of the present invention.
Figure 14:
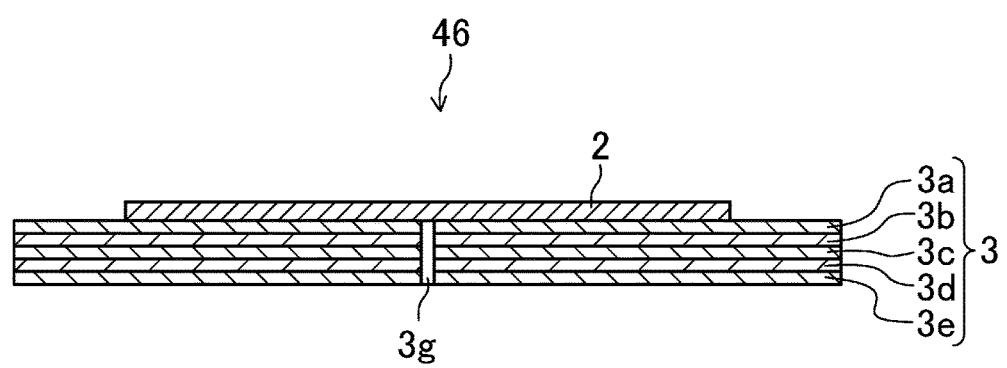
FIG. 14 is a cross-sectional view schematically showing a configuration of an organic EL display device according to a further variation of the present invention.

Just like an organic EL display device 45 shown in FIG. 13, a plurality of protective layers 3a to 3e may be bonded to one another at one side 3f of the perimeter of the protective member 3 to retain the protective layers 3a to 3e forming the protective member 3. A plurality of protective layers 3a to 3e may be bonded to one another at a portion of a protective member 3 except the one side 3f of the perimeter of the protective member 3, such as a central portion 3g of a protective member 3, just like an organic EL display device 46 shown in FIG. 14, for example.

Figure 15:
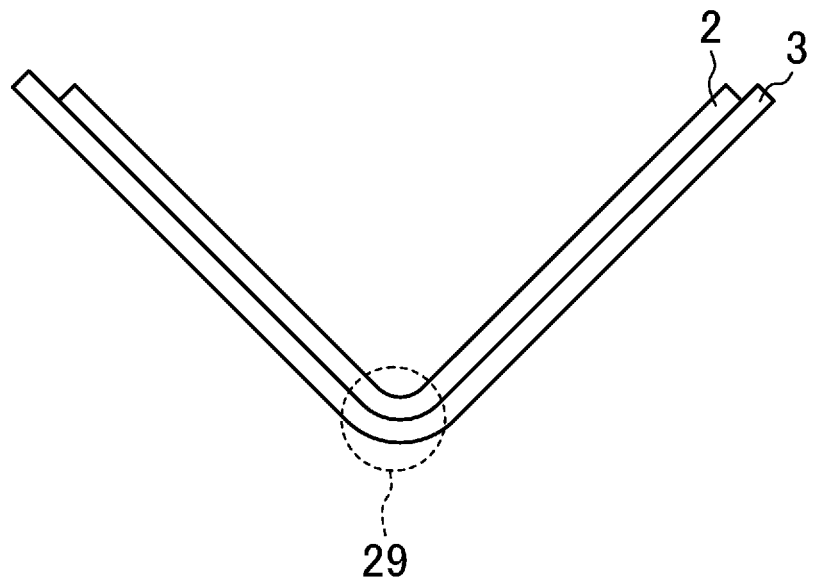
FIG. 15 is a cross-sectional view schematically showing a configuration of an organic EL display device according to a further variation of the present invention.

As illustrated in FIG. 15, protective layers 3a to 3e may be bonded to one another at a bent portion 29 of an organic EL display device 1.

Figure 16:
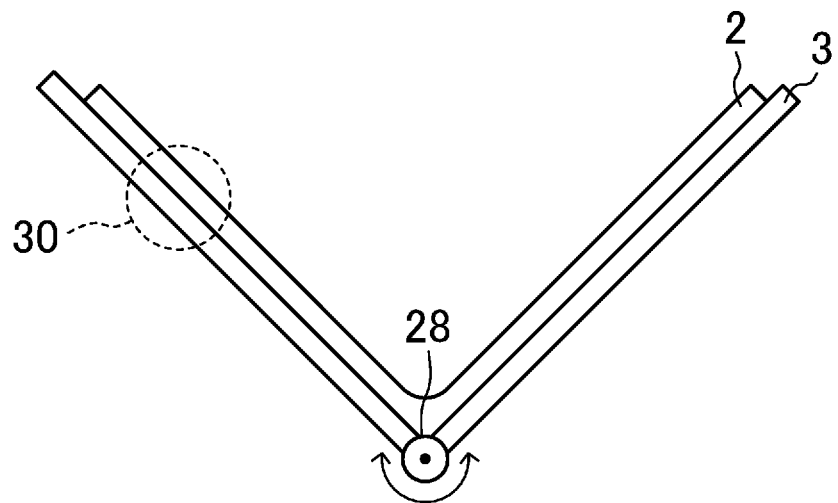
FIG. 16 is a schematic view schematically showing a configuration of an organic EL display device according to a further variation of the present invention.

As illustrated in FIG. 16, a protective member 3 may be provided with a hinge 28, which connects parts of the protective member 3 together so that the protective member 3 is bendable. In this case, the hinge 28 is provided while adjacent ones of the protective layers 3a to 3e are in contact with each other. The protective layers 3a to 3e may be bonded to one another at a portion of the protective member 3 except the hinge 28 and its surrounding area (e.g., a portion 30 of the protective member 3 on which no stress acts when the protective member 3 is bent).

Figure 17:
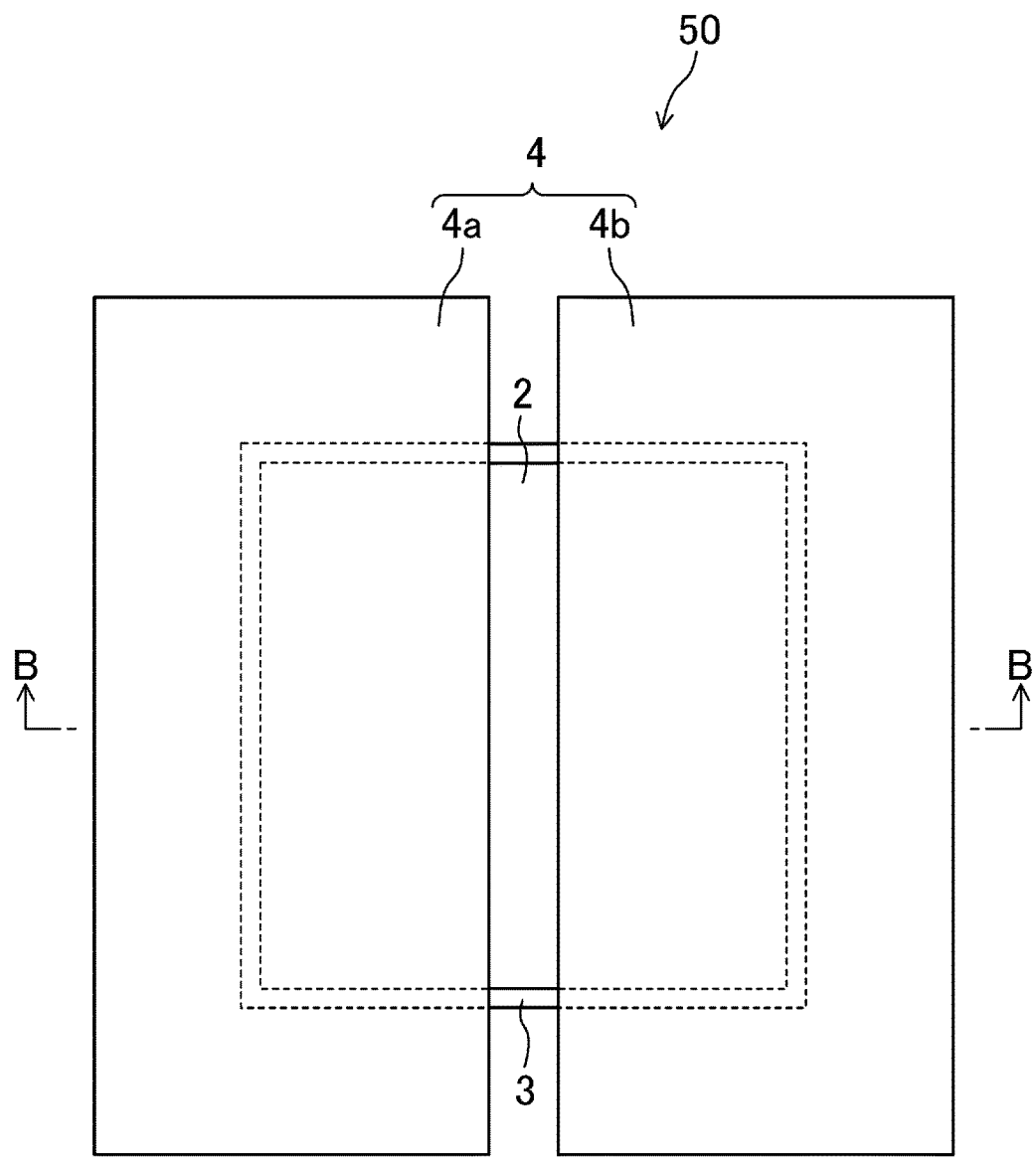
FIG. 17 is a schematic view schematically showing a configuration of an organic EL display device according to a further variation of the present invention.
Figure 18:
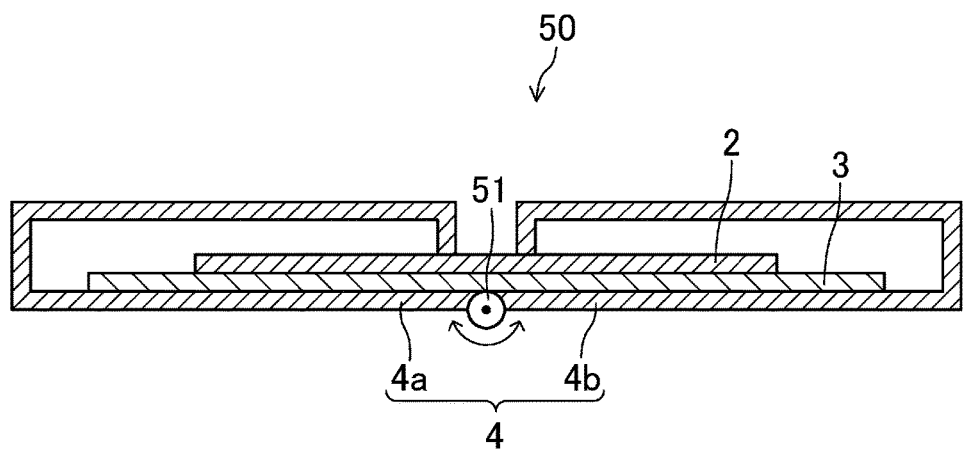
FIG. 18 is a cross-sectional view schematically showing a configuration of the organic EL display device according to the further variation of the present invention and taken along line B-B shown in FIG. 17.

In the foregoing embodiments, the support member 4 contains a resin material, rubber, or any other suitable material. However, the support member 4 may contain a metal material. In this case, just like an organic EL display device 50 shown in FIGS. 17 and 18, a support member 4 includes a first support sub-member 4a and a second support sub-member 4b, which are connected together through a hinge 51 so as to be bendable. In this case, the support member 4 is bendable only about the rotation axis of the hinge 51.

To improve the slidability of the protective layers 3a to 3e, a lubricant may be applied between each adjacent pair of the protective layers 3a to 3e. Examples of this lubricant include grease.

The foregoing embodiments have described an organic electroluminescence (EL) display panel as a display panel. However, the display panel may be a liquid crystal display (LCD) panel, an electrophoretic display panel, a plasma display (PD) panel, a plasma addressed liquid crystal display (PALC) panel, an inorganic EL display panel, a field emission display (FED) panel, a surface-conduction electron-emitter display (SED) panel, or any other display panel.

INDUSTRIAL APPLICABILITY

As can be seen from the foregoing description, the present invention is useful for a flexible organic EL display device.

DESCRIPTION OF REFERENCE CHARACTERS

1 Organic EL Display Device
2 Organic EL Display Panel
3 Protective Member
3a to 3e Protective Layer
4 Support Member
5 Organic EL Element
20 Organic EL Display Device
25 Organic EL Display Device
26 Elastic Member
27 Organic EL Display Device

The invention claimed is:

1. An organic EL display device comprising:
an organic EL display panel including a flexible plastic substrate and an organic EL element formed on the plastic substrate; and
a protective member provided on the organic EL display panel, the protective member being bendable, wherein
the protective member includes a plurality of protective layers stacked so as to be mutually slidable,
the organic EL display panel and one of the protective layers being in contact with the organic EL display panel are fixed to each other, and
a coefficient of friction of each of the protective layers measured according to JIS K 7218 (a friction and wear test) is 0.04 to 1.

2. The device of claim 1, wherein
each of the protective layers has a thickness of 10 to 300 μm.

3. The device of claim 1, wherein
one of an adjacent pair of the protective layers closer to the organic EL display panel has a smaller thickness than the other.

4. The device of claim 1, further comprising:
a support member supporting the protective member.

5. The device of claim 4, wherein
the support member contains a metal material, and includes a first support sub-member and a second support sub-member, and
the first and second support sub-members are connected together through a hinge so that the support member is bendable.

6. The device of claim 4, wherein
the support member includes an elastic member supporting the protective member.

7. The device of claim 1, further comprising:
a guide pin provided around the protective member to retain the protective member.

8. The device of claim 1, wherein
the protective member has a hole,
the device further includes a pin inserted through the hole to retain the protective member.

9. The device of claim 1, wherein
the protective layers are bonded to one another at a bent portion of the protective member.

10. The device of claim 1, wherein
the protective layers are bonded to one another at one side of a perimeter of the protective member.

11. An organic EL display device comprising:
an organic EL display panel including a flexible plastic substrate and an organic EL element formed on the plastic substrate; and
a protective member provided on the organic EL display panel, the protective member being bendable, wherein
the protective member includes a plurality of protective layers stacked so as to be mutually slidable,
the organic EL display panel and one of the protective layers being in contact with the organic EL display panel are fixed to each other, and
each of the protective layers has a thickness of 10 to 300 µm.

12. The device of claim 11, further comprising:
a support member supporting the protective member.

13. The device of claim 11, further comprising:
a guide pin provided around the protective member to retain the protective member.

14. The device of claim 11, wherein
the protective member has a hole,
the device further includes a pin inserted through the hole to retain the protective member.

15. The device of claim 11, wherein
the protective layers are bonded to one another at a bent portion of the protective member.

16. The device of claim 11, wherein
the protective layers are bonded to one another at one side of a perimeter of the protective member.

17. An organic EL display device comprising:
an organic EL display panel including a flexible plastic substrate and an organic EL element formed on the plastic substrate;
a protective member provided on the organic EL display panel, the protective member being bendable; and
a guide pin provided around the protective member to retain the protective member, wherein
the protective member includes a plurality of protective layers stacked so as to be mutually slidable, and
the organic EL display panel and one of the protective layers being in contact with the organic EL display panel are fixed to each other.

18. The device of claim 17, further comprising:
a support member supporting the protective member.

19. The device of claim 17, wherein
the protective layers are bonded to one another at a bent portion of the protective member.

20. The device of claim 17, wherein
the protective layers are bonded to one another at one side of a perimeter of the protective member.

* * * * *